(12) United States Patent
Katase et al.

(10) Patent No.: US 10,831,235 B2
(45) Date of Patent: Nov. 10, 2020

(54) ELECTRONIC MODULE AND IMAGING SYSTEM

(71) Applicant: CANON KABUSHIKI KAISHA, Tokyo (JP)

(72) Inventors: Yu Katase, Kawasaki (JP); Tadashi Kosaka, Oita (JP); Koichi Shimizu, Fujisawa (JP); Shuichi Chiba, Kawasaki (JP); Kazuya Notsu, Yokohama (JP); Hisatane Komori, Ayase (JP); Satoru Hamasaki, Fujisawa (JP); Ikuto Kimura, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/358,010

(22) Filed: Mar. 19, 2019

(65) Prior Publication Data
US 2019/0294213 A1 Sep. 26, 2019

(30) Foreign Application Priority Data

Mar. 26, 2018 (JP) .................. 2018-058243

(51) Int. Cl.
| | | |
|---|---|---|
| H05K 7/00 | (2006.01) | |
| G06F 1/16 | (2006.01) | |
| H04N 5/232 | (2006.01) | |
| H01L 27/146 | (2006.01) | |
| H04N 5/3745 | (2011.01) | |

(52) U.S. Cl.
CPC ...... *G06F 1/1607* (2013.01); *H01L 27/14605* (2013.01); *H04N 5/23229* (2013.01); *H04N 5/37455* (2013.01)

(58) Field of Classification Search
USPC .......................................... 361/760
See application file for complete search history.

(56) References Cited

U.S. PATENT DOCUMENTS

| | | | | |
|---|---|---|---|---|
| 5,852,320 A | * | 12/1998 | Ichihashi | ............ G01L 19/0038 257/419 |
| 8,680,636 B2 | | 3/2014 | Yajima | |
| 9,774,769 B2 | | 9/2017 | Suzuki | |
| 9,978,675 B2 | | 5/2018 | Suzuki | |
| 2015/0116975 A1 | * | 4/2015 | Suzuki | ................... H01L 23/36 361/809 |
| 2015/0279770 A1 | | 10/2015 | Kataoka | |

FOREIGN PATENT DOCUMENTS

| | | |
|---|---|---|
| JP | 2008-251712 | 10/2008 |
| JP | 2012-69851 | 4/2012 |
| JP | 2014-225580 | 12/2014 |
| JP | 2015-12211 | 1/2015 |
| JP | 2016-111270 | 6/2016 |

* cited by examiner

Primary Examiner — Andargie M Aychillhum
(74) Attorney, Agent, or Firm — Venable LLP

(57) ABSTRACT

Provided is an electronic device that suppresses an increase in internal pressure while suppressing entry of a foreign material. An electronic module according to the present embodiment has an electronic device, a substrate, a frame, and a cover, a hole portion having a first opening in a first main surface and a second opening in a second main surface and communicating the internal space and the external space, and a component is disposed to face the second opening.

20 Claims, 14 Drawing Sheets

ELECTRONIC MODULE AND IMAGING SYSTEM

BACKGROUND OF THE INVENTION

Field of the Invention

The present technology relates to an electronic module and an imaging system.

Description of the Related Art

In recent years, in electronic components in which an electronic device such as an imaging device is mounted and a hollow sealed space is included, a large internal pressure may be applied to an electronic component due to a change in the temperature or a change in the atmospheric pressure in a wide variety of operating environments in manufacturing of the electronic components. Increase in internal pressure may cause peeling, cracking, displacement, or the like of a cover. Further, even when the cover is not peeled off, a component near the cover may be interfered by the expanding cover. Furthermore, the expansion of a substrate may cause a displacement of an electronic device, and when the electronic device is an imaging device or the like, the image quality may be deteriorated. In particular, when a PCB substrate or the like that has lower strength compared to a ceramic substrate or the like is used as a substrate, the substrate is more likely to expand, which may significantly affect the image quality. Therefore, an electronic component with a hollow sealed space is required to have tolerance against a large internal pressure or suppress an increase in the internal pressure.

Japanese Patent Application Laid-Open No. 2016-111270 proposes a technology that provides a penetrating portion through which a hollow portion communicates with the outside communicate at the bottom portion of the package that forms the electronic component and closes the penetrating portion with solder when soldered to a substrate. Further, Japanese Patent Application Laid-Open No. 2012-69851 proposes a technology that fills a penetrating portion with a permeable resin, and Japanese Patent Application Laid-Open No. 2008-251712 proposes a technology that forms a permeable filter in a penetrating portion.

In Japanese Patent Application Laid-Open No. 2016-111270, however, while an increase of internal pressure due to a change in the temperature caused by reflow or the like at being soldered to a substrate can be prevented, an increase of internal pressure after completion of the electronic component cannot be prevented. Further, in Japanese Patent Application Laid-Open No. 2012-69851 and Japanese Patent Application Laid-Open No. 2008-251712, while an increase of internal pressure and entry of a foreign material can be prevented after completion of the electronic component, there is a problem of being unable to prevent an increase of internal pressure due to an exponential change because of low air permeability of the permeable resin or the permeable filter.

SUMMARY OF THE INVENTION

The present technology intends to provide an electronic module that suppresses an increase in internal pressure while suppressing entry of a foreign material.

According to one embodiment of the present disclosure, provided is an electronic module having: a substrate having a first main surface and a second main surface; an electronic device attached to the first main surface; a component connected to the second main surface via a conductive material; a frame attached to the first main surface so as to surround the electronic device; and a cover attached to the frame so as to face the electronic device, wherein a hole portion having a first opening in the first main surface and a second opening in the second main surface and communicating an internal space formed by the substrate, the frame, and the cover with an external space, and wherein the component is disposed to face the second opening.

According to the present invention, an electronic module that suppresses an increase in internal pressure while suppressing entry of a foreign material can be provided.

Further features of the present invention will become apparent from the following description of exemplary embodiments with reference to the attached drawings.

DESCRIPTION OF THE EMBODIMENTS

Embodiments to implement the present technology will be described below with reference to the drawings. Note that, in the following description and drawings, components that are used commonly across a plurality of drawings are labeled with the same reference. Further, the common component may be described by referring to a plurality of drawings mutually. Further, the description of the component with the common reference may be omitted.

First Embodiment

Figure 1A:
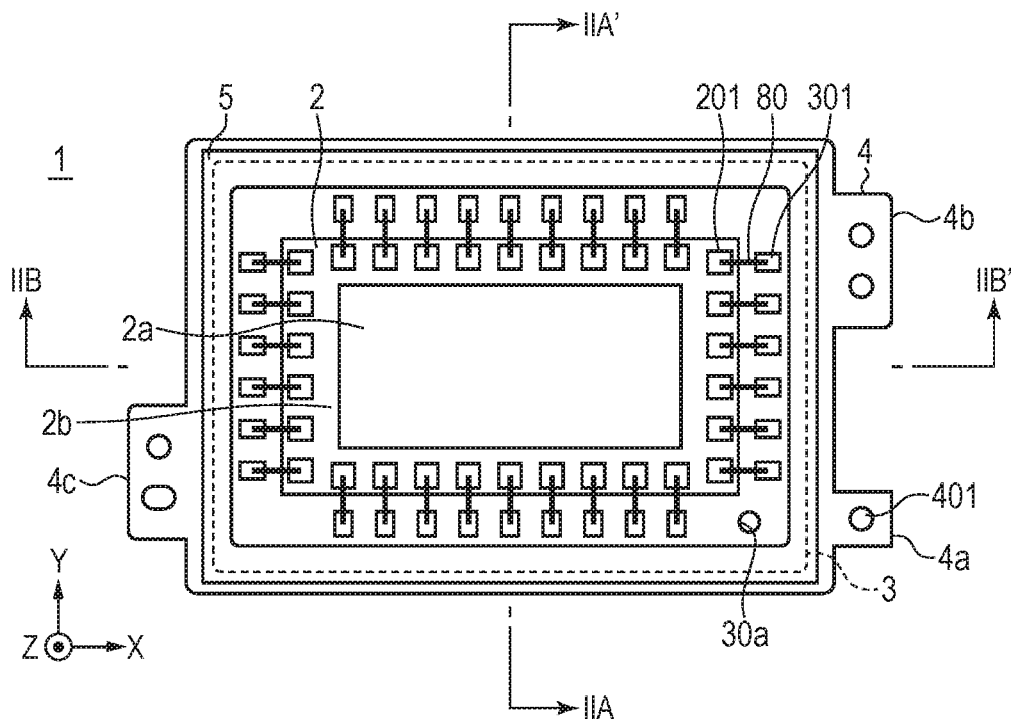
FIG. 1A is a planar view of an electronic module according to a first embodiment.
Figure 1B:
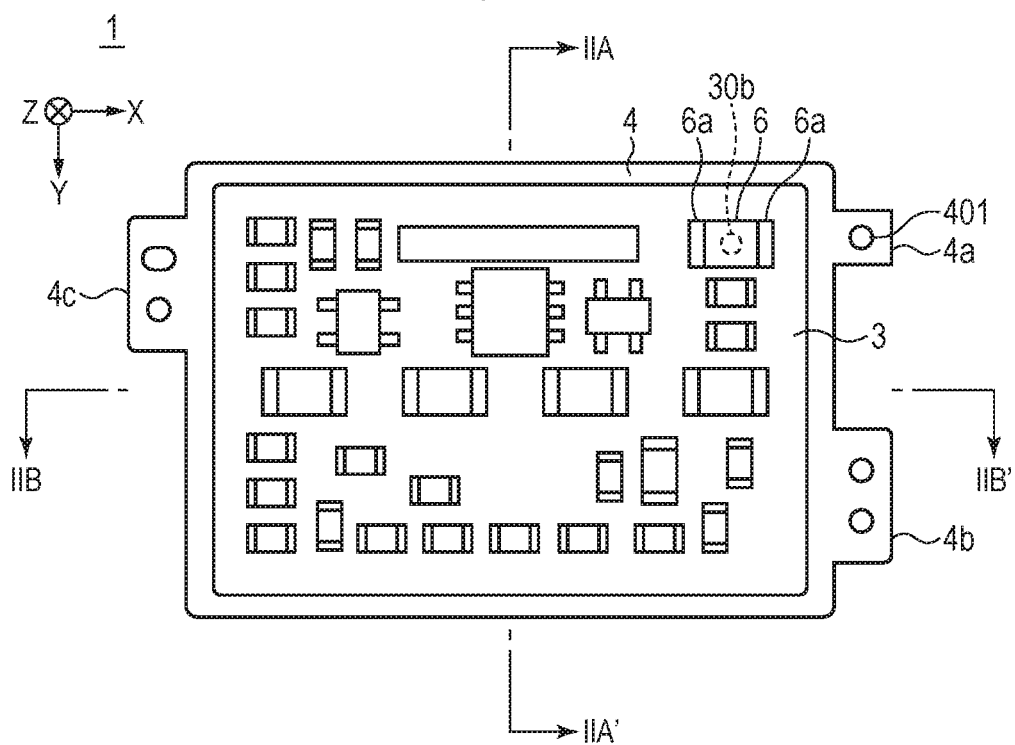
FIG. 1B is a planar view of the electronic module according to the first embodiment.
Figure 2A:
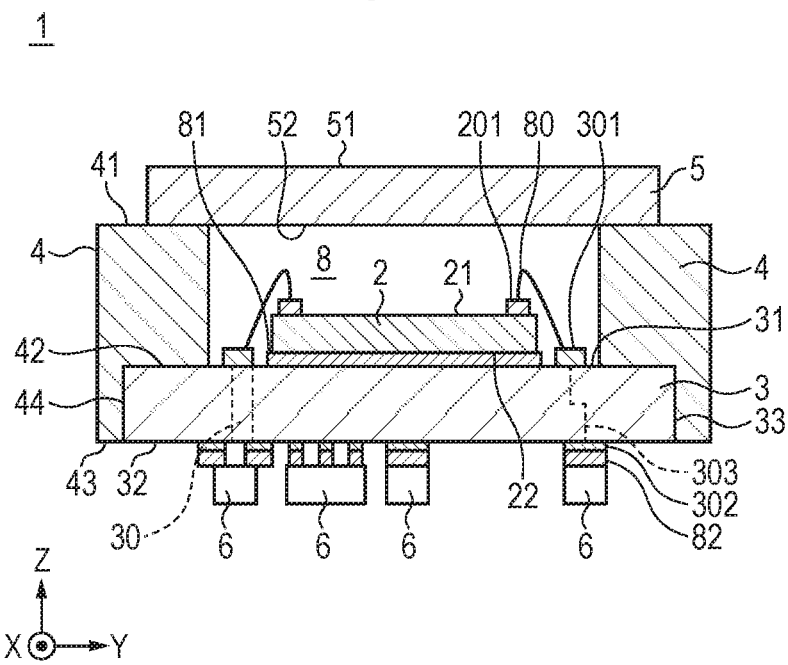
FIG. 2A is a sectional view of the electronic module according to the first embodiment.
Figure 2B:
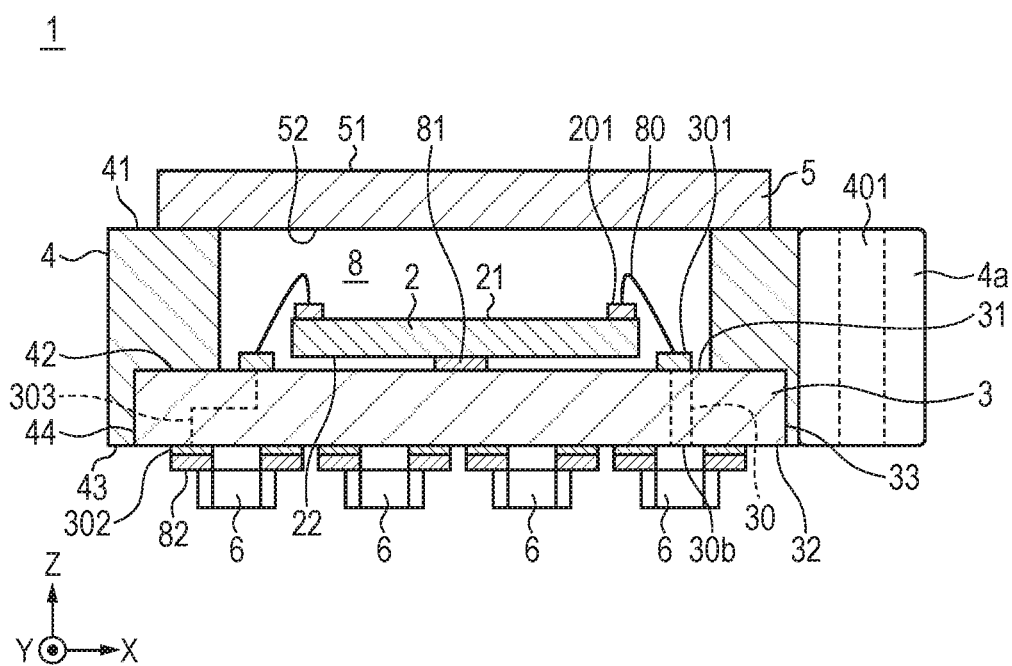
FIG. 2B is a sectional view of the electronic module according to the first embodiment.

An electronic module according to a first embodiment of the present disclosure will be described below. FIG. 1A is a top view of an electronic module 1, and FIG. 1B is a bottom view of the electronic module 1. FIG. 2A is a sectional view of the electronic module 1 taken along a line IIA-IIA' in FIG. 1A and FIG. 1B, and FIG. 2B is a sectional view of the electronic module 1 taken along a line IIB-IIB'. The same members are labelled with the common reference, and description will be provided below with reference to each diagram mutually.

In FIG. 1A, FIG. 1B, FIG. 2A, and FIG. 2B, the electronic module 1 has a planar shape with a predetermined height (thickness). The direction of the height of the electronic module 1 is here denoted as a Z-direction. Further, a longitudinal direction and a short direction of the electronic module 1 are denoted as an X-direction and a Y-direction, respectively. A typical electronic module 1 has a rectangular shape extending in the X-direction and the Y-direction. Further, a length of the electronic module 1 in the Z-direction is shorter than the lengths in the X-direction and the Y-direction. For the purpose of illustration below, the length in the Z-direction may be referred to as a thickness or a height.

The electronic module 1 has an electronic device 2, a substrate 3, a frame 4, a cover 5, and a plurality of components 6. The electronic module 1 has a substantially rectangular parallelepiped shape, the substrate 3 is provided to an opening below the frame 4, and the cover 5 is provided to an opening on the top of the frame 4. The substrate 3 and the cover 5 are provided to the frame 4 so as to face each other, and an internal space 8 is formed inside the electronic module 1 surrounded by the substrate 3, the frame 4, and the cover 5. The substrate 3 and the frame 4 mechanically fix the electronic module 1 and allow the electronic module 1 to function as a mounting member that can be electrically connected. The cover 5 has a rectangular plate shape and can function as an optical member. The electronic device 2 is fixed to the substrate 3. The component 6 is mounted to a surface of the substrate 3 opposite to the surface on which the electronic device 2 is implemented. Each member will be described below in detail.

The substrate 3 has a rectangular plate shape extending in the X-direction and the Y-direction, which has an upper surface (first main surface) 31 of the substrate 3 and a lower surface (second main surface) 32 of the substrate 3. The electronic device 2 is mounted on the upper surface 31 of the substrate 3, and a plurality of components 6 are mounted on the lower surface 32 of the substrate 3. At least one hole portion 30 that penetrates the upper surface 31 and the lower surface 32 is formed in the substrate 3. The hole portion 30 communicates the internal space 8 of the electronic module 1 with the external space. The substrate 3 has an internal terminal 301 on the upper surface 31 and an outer terminal 302 on the lower surface 32. The internal terminal 301 and the outer terminal 302 are electrically connected to each other via an embedded portion 303 embedded inside the substrate 3 as an internal wiring. The embedded portion 303 may be formed of a penetrating hole or the like filled with a conductive material as with a so-called via hole or a through hole.

The substrate 3 may be formed by molding, cutting processing, stacking of plate materials, or the like. The substrate 3 may have an insulator that insulates the internal terminal 301 and the outer terminal 302 from each other. The substrate 3 may be a flexible substrate such as a polyimide substrate, a glass epoxy substrate, a composite substrate, a glass composite substrate, a bakelite substrate, or a rigid substrate such as a ceramic substrate. A glass epoxy substrate is preferably used. The hole portion 30 can be easily formed by forming the substrate 3 with the glass epoxy substrate. Further, the glass epoxy substrate has appropriate strength compared to a flexible substrate. Therefore, there is an advantage of being able to increase the strength of the electronic module 1 including the frame 4 and the cover 5 and further facilitating manufacturing of the electronic module 1.

While the type of the electronic device 2 is not particularly limited, it may be typically an optical device. In the present embodiment, the electronic device 2 has a main region 2a and a sub-region 2b. Typically, the main region 2a is located at the center of the electronic device 2, and the sub-region 2b is located at the periphery of the main region 2a. When the electronic device 2 is an imaging device such as a CCD image sensor or a CMOS image sensor, the main region 2a is an imaging region and the sub-region 2b may be a region such as a readout circuit or a drive circuit. When the electronic device 2 is a display device such as a liquid crystal display or an EL display, the main region 2a may be a display region.

When the electronic device 2 is an imaging device, an upper surface 21, which is a surface facing the cover 5 of the electronic device 2, is a light incidence surface. The light incidence surface may be formed of the outermost layer of a multilayer film provided on the semiconductor substrate with a light reception surface. The multilayer film includes a layer having an optical function such as a color filter layer, a micro-lens layer, an antireflection layer, or a light shielding layer, a layer having a mechanical function such as a planarizing layer, a layer having a chemical function such as a passivation layer, or the like. A drive circuit used for driving the main region 2a or a signal processing circuit used for processing a signal from the main region 2a or a signal to the main region 2a is provided to the sub-region 2b. In the electronic device 2, the circuits described above are easily formed monolithically. Further, an electrode 201 (electrode pad) used for inputting and outputting a signal between the electronic device 2 and the outer circuit is provided to the sub-region 2b.

As illustrated in FIG. 2A and FIG. 2B, the electronic device 2 is connected to the upper surface 31 of the substrate 3 via an adhesive material 81 arranged between the upper surface 31 of the substrate 3 and the lower surface 22 of the electronic device 2. The electrode 201 of the electronic device 2 and the internal terminal 301 of the substrate 3 are electrically connected to each other via a connection conductor 80. While the connection conductor 80 may be a metal wire such as a wire bonding in the present embodiment, the connection between the electrode 201 and the internal terminal 301 may be a flip chip connection. In such a case, the electrode 201 is provided on the lower surface 22 of the electronic device 2, and the internal terminal 301 and the connection conductor 80 are located on the orthogonal projection region of the lower surface 22 of the electronic device 2.

The component 6 is connected to the outer terminal 302 located on the lower surface 32 of the substrate 3 via a conductive material 82. Inside the component 6, a surface facing to the lower surface 32 of the substrate 3 has a region not fixed to the outer terminal 302. That is, an air gap corresponding to the sum of the thickness of the outer terminal 302 and the thickness of the conductive material 82 is formed between the component 6 and the lower surface 32 of the substrate 3. The conductive material 82 may be a solder or the like, for example.

The component 6 can be fixed at any timing before, during, or after the substrate 3 is fixed to the electronic device 2, the frame 4, or the cover 5. To prevent entry of a foreign material during the manufacturing process, the component 6 is preferably fixed before the step of preparing the substrate 3, that is, before the substrate 3 is fixed to any one of the electronic device 2, the frame 4, and the cover 5.

While the type of the component 6 is not particularly limited, an active element such as a diode or a transistor, a passive element such as a resistor, a chip capacitor, an integrated circuit (IC), a connector, or the like may be appropriately included. While the component 6 is typically a surface mounting component, any type may be used as long as an air gap can be formed between the component 6 and the lower surface 32 of the substrate 3. The component 6 described above can improve the function and performance of the electronic module 1. Further, a connector used as the component 6 can facilitate incorporation of the electronic module 1 into a casing of an electronic device or the like. In the present embodiment, multiple types of the components 6 are implemented on the lower surface 32 of the substrate 3. The electronic module 1 formed in such a way is incorporated in a casing to form an electronic device.

The frame 4 has two openings and can accommodate the electronic device 2 so as to surround the electronic device 2. A recess 44 is formed on the inner periphery of one opening of the frame 4. That is, in one surface of two surfaces of upper and lower surfaces of the frame 4, the recess 44 is formed between the frame lower surface 42 and the lowermost surface 43 of the frame 4, and a side end portion 33 of the substrate 3 is inserted into the recess 44. The height of the recess 44 preferably corresponds to the thickness of the substrate 3. Thereby, the lower surface 32 of the substrate 3 and the lowermost surface 43 of the frame 4 are located on the same plane, and the connection portion between the frame 4 and the substrate 3 can be formed flat. The frame 4 can be bonded to the substrate 3 with an adhesive material (not illustrated).

The frame 4 further has attachment portions 4a, 4b, and 4c. The attachment portions 4a, 4b, and 4c protrude from the short side of the frame 4, and the attachment portions 4b and 4c are formed at positions to be point symmetric in a planar view, respectively. Through holes 401 are provided in the attachment portions 4a, 4b, and 4c along the Z-direction. The through hole 401 can be used as a screw hole used for attaching the electronic module 1 to a casing or a substrate of an electronic device. Further, the through hole 401 can be used as a hole used for positioning the electronic module 1.

The frame 4 may be formed with various materials such as a ceramic, a metal, a resin, or the like. Aluminum, an aluminum alloy, copper, a copper alloy, an iron alloy or the like can be used as the metal material. Iron alloys including chromium, nickel, and cobalt are more preferable, in addition to stainless steel. SUS 430, which is ferritic stainless steel, SUS 304, which is austenitic stainless steel, 42 alloy, Kovar, or the like can be used, for example. An epoxy resin, an acrylic resin, a silicone resin, a vinyl resin, or the like can be used as the resin material. A dry solidification type by using evaporation of solvent, a chemical reaction type that is cured by polymerization of molecules by using light or heat or the like, a thermal fusion (hot melt) type that is solidified by solidification of a molten material, or the like can be used as an organic material. Typically, a photocurable resin that is cured by ultraviolet light or visible light, or a thermosetting resin that is cured by heat can be used. Note that, when the frame 4 is formed of a resin material, the substrate 3 and the frame 4 can be formed in close contact with each other by a resin molding method such as a transfer molding method. Especially when the frame 4 is fixed to the upper surface 31 of the substrate 3 and the side end portion 33, fixing by the resin molding method is easier than fixing with an adhesive material. Therefore, the frame 4 is preferably formed by using the resin molding method.

The cover 5 has a rectangular plate shape and a function of protecting the electronic device 2. When the electronic device 2 is an imaging element, the cover 5 is required to have transparency to light, typically visible light. A plastic, a glass, a crystal, or the like can be used as a preferable material to have transparency. An antireflection coating or an infrared cut coating can be applied to a front surface 51 of the cover 5. The cover 5 is attached to an upper surface 41 of the frame 4, which is the other opening end of the frame 4, so as to face the electric device 2. A cover lower surface 52 is adhered to the frame upper surface 41 via an adhesive material (not illustrated), and thereby the internal space 8, which is surrounded by the substrate 3, the frame 4, and the cover 5, is formed.

In the present embodiment, since the hole portion 30 is provided in the substrate 3, the hole portion 30 can suppress an increase in the internal pressure in the internal space 8. In order to effectively suppress an increase in the internal pressure in the internal space 8, the opening (first opening) 30a of the hole portion 30 in the upper surface 31 may be formed between the electronic device 2 and the frame 4 (see FIG. 1A). By forming the hole portion 30 between the electronic device 2 and the frame 4, the air in the internal space 8 is easily discharged to the external space, and thereby an increase of the internal pressure can be effectively suppressed. The opening (second opening) 30b of the hole portion 30 on the lower surface 32 of the substrate 3 is formed on the orthogonal projection region of the component 6. That is, the opening 30b of the hole portion 30 on the lower surface 32 may be formed at a position facing the component 6 (see FIG. 1B). Further, the opening 30b is preferably formed at a position shifted from an electrode 6a of the component 6 such that the opening 30b of the hole portion 30 is not closed by the electrode 6a of the component 6. Further, the internal diameter of the opening 30b is preferably smaller than the outer diameter of the component 6. An air gap is formed between the component 6 and the lower surface 32 of the substrate 3, and the opening 30b may be formed at the position of the air gap. Therefore, the air gap between the component 6 and the lower surface 32 of the substrate 3 can maintain permeability and suppress an increase in internal pressure. Further, by forming the opening 30b at a position facing the component 6, entry of a foreign material from external space can be blocked by the component 6. Therefore, entry of a foreign material from the external space into the internal space 8 can be suppressed.

Therefore, according to the present embodiment, an increase of internal pressure can be suppressed while entry of a foreign material into the internal space can be prevented. Further, since a filter is not required to be used, an increase of the internal pressure in the internal space due to deterioration of permeability or clogging, degradation of the filter can be avoided. Further, increase in cost, degradation of yield, or the like that man be caused by providing a filter can be also avoided.

Second Embodiment

Figure 3:
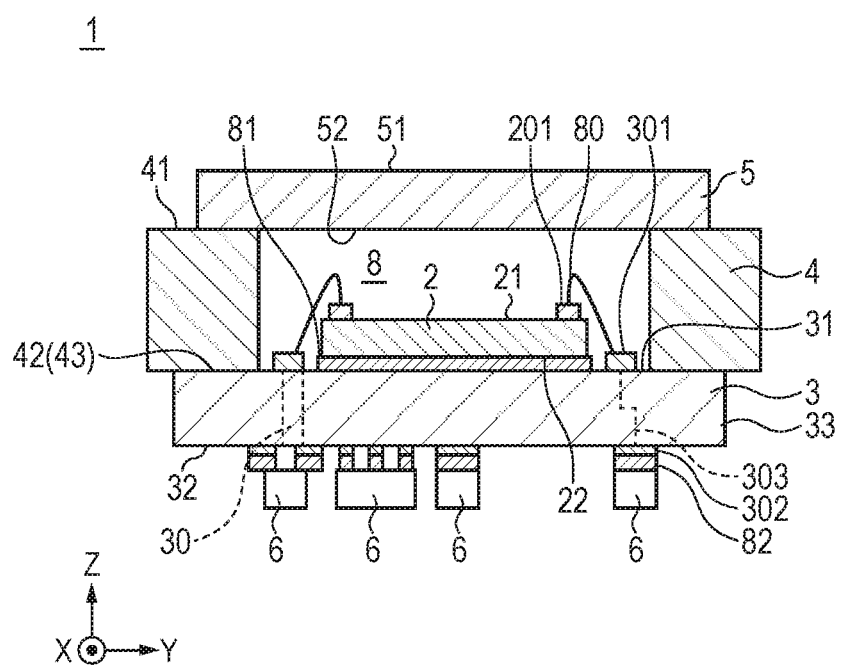
FIG. 3 is a sectional view of an electronic module according to a second embodiment.

Next, an electronic module according to the present embodiment will be described mainly focusing on a configuration different from that of the first embodiment. FIG. 3 illustrates a sectional view of the electronic module 1 according to the present embodiment. The electronic module 1 illustrated in FIG. 3 is a modified example of the first embodiment, and a sectional view of a part corresponding to FIG. 2A is illustrated. In the present embodiment, the lower surface 42 of the frame 4 is formed flat, and the lowermost surface 43 of the frame 4 in the first embodiment corresponds to the lower surface 42 of the frame 4. The upper face 31 of the substrate 3 is adhered to the lower surface 42 of the frame 4. According to the present embodiment, a step between the lower surface 42 and the lowermost surface 43 of the frame 4 is not required to be formed, and thereby the frame 4 can be easily molded. Also in the present embodiment, the same advantage as that of the first embodiment can be obtained.

Third Embodiment

Figure 4:
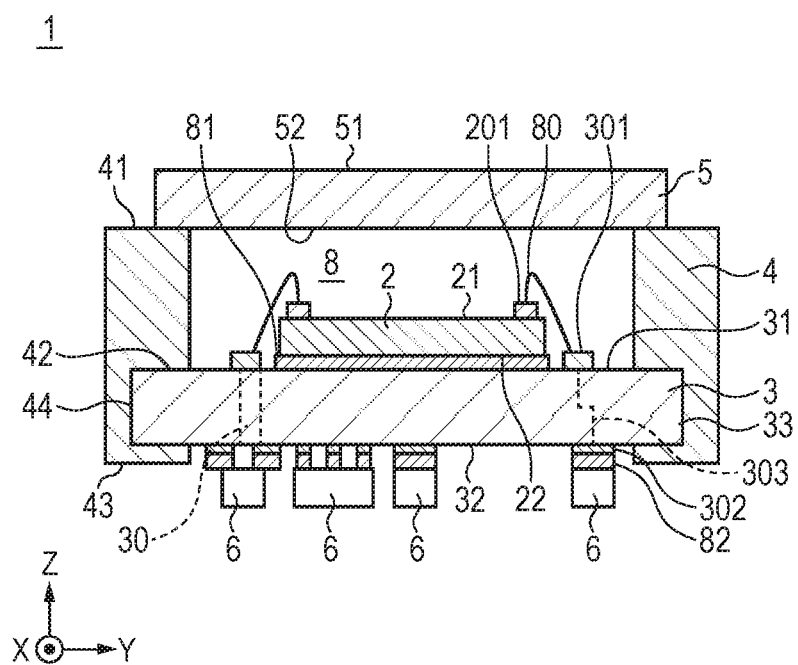
FIG. 4 is a sectional view of an electronic module according to a third embodiment.

FIG. 4 is a sectional view of an electronic module according to the present embodiment and illustrates a further modified example of the first embodiment. In the present embodiment, the recess 44 is formed on the inner periphery of the opening end of the frame 4, and the side end portion 33 of the substrate 3 is inserted into the recess 44. The upper face 31 of the substrate 3 comes into contact with the lower surface 42 of the frame 4, and the lowermost surface 43 of the frame 4 is located below the lower surface 32 of the substrate 3. In the present embodiment, the frame 4 is preferably formed so as to be in close contact with the substrate 3 by a resin molding method such as a transfer molding method.

Note that a surface of the frame 4 where the substrate 3 is fixed is not limited to that described in the first to third embodiments. Further, a method of fixing the substrate 3 to the frame 4 is not limited to a method using an adhesive material. When the frame 4 is made of a resin material, the substrate 3 and the frame 4 may be fixed to each other by a resin molding method such as a transfer molding method.

According to the present embodiment, the substrate 3 can be fixed to the frame 4 while forming the frame 4 by a resin mold, and the substrate 3 and the frame 4 can be in close contact with each other. Further, even in the present embodiment, the hole portion 30 is formed in the substrate 3. Therefore, an increase of the internal pressure of the internal space 8 can be suppressed while entry of a foreign material from the external space into the internal space 8 can be prevented.

Fourth Embodiment

Figure 5A:
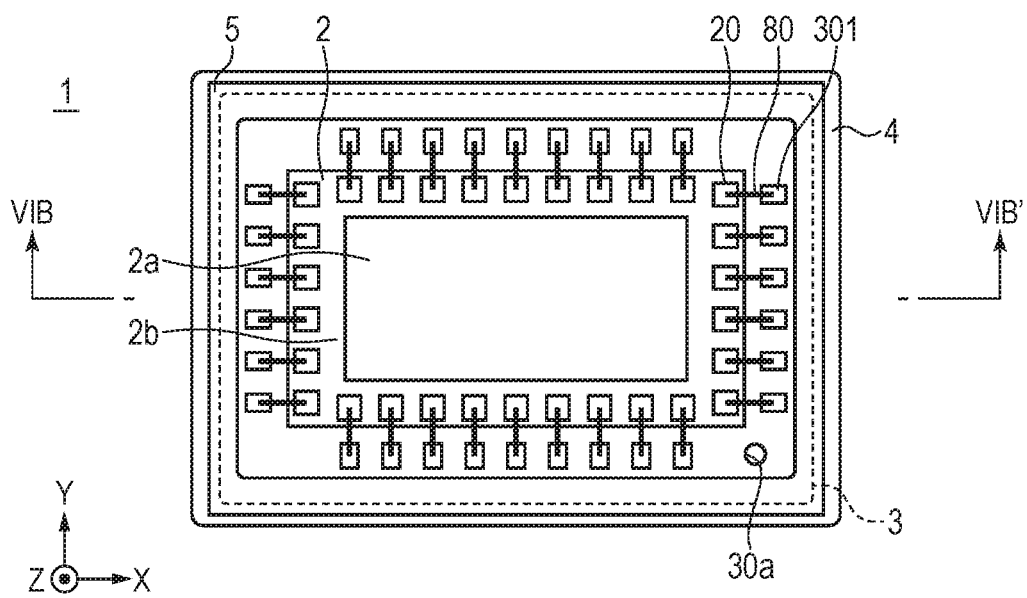
FIG. 5A is a planar view of an electronic module according to a fourth embodiment.
Figure 5B:
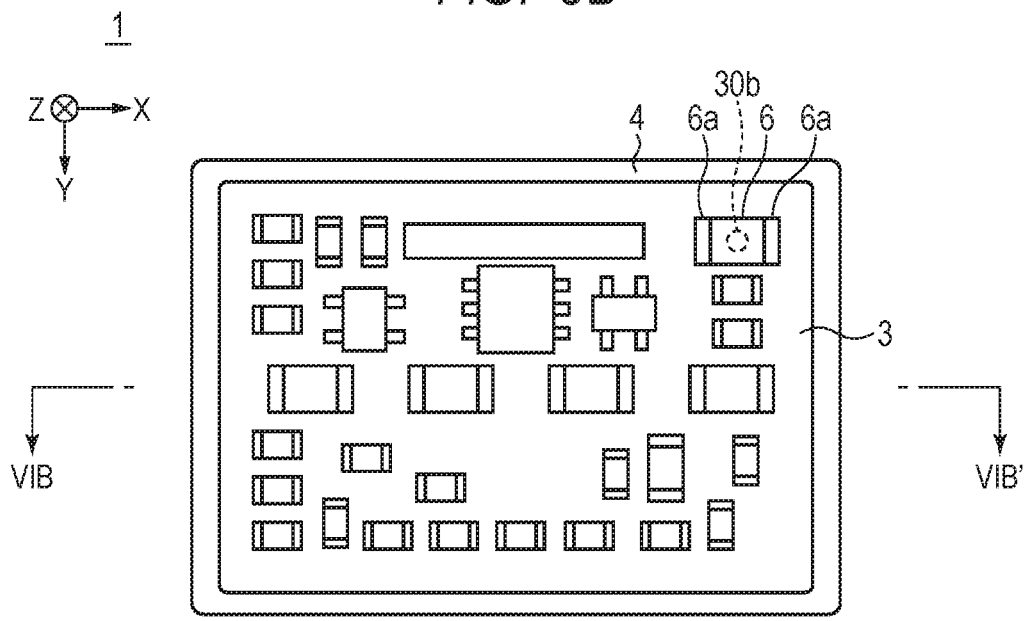
FIG. 5B is a planar view of the electronic module according to the fourth embodiment.
Figure 6:
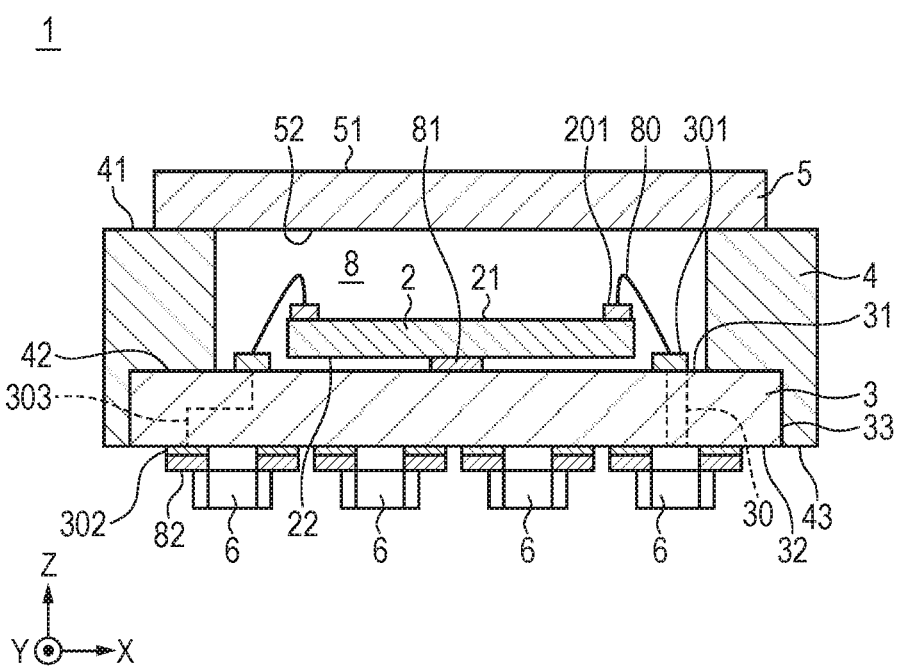
FIG. 6 is a sectional view of the electronic module according to the fourth embodiment.

An electronic module according to the present embodiment is a further modified example of the first embodiment. FIG. 5A and FIG. 5B are planar views of the electronic module 1 according to the present embodiment, and FIG. 6 is a sectional view of the electronic module 1 taken along a line VIB-VIB'. The frame 4 according to the present embodiment does not have the attachment portions 4a, 4b, and 4c and the through hole 401 according to the first embodiment. Since the attachment portions 4a, 4b, and 4c are not formed on the frame 4, the electronic module 1 can be reduced in size in the X-direction and the Y-direction. In this case, the electronic module 1 may be directly fixed on a substrate of an electronic device by using solder or the like. Further, also in the present embodiment, it is possible to suppress an increase in the internal pressure of the internal space while preventing entry of a foreign material from the external space into the internal space.

Fifth Embodiment

An electronic module according to a fifth embodiment of the present disclosure will be described below. The electronic module 1 according to the present embodiment is different from the first embodiment in the position of the hole portion 30. The present embodiment will be described below mainly focusing on a configuration different from that of the first embodiment.

Figure 7A:
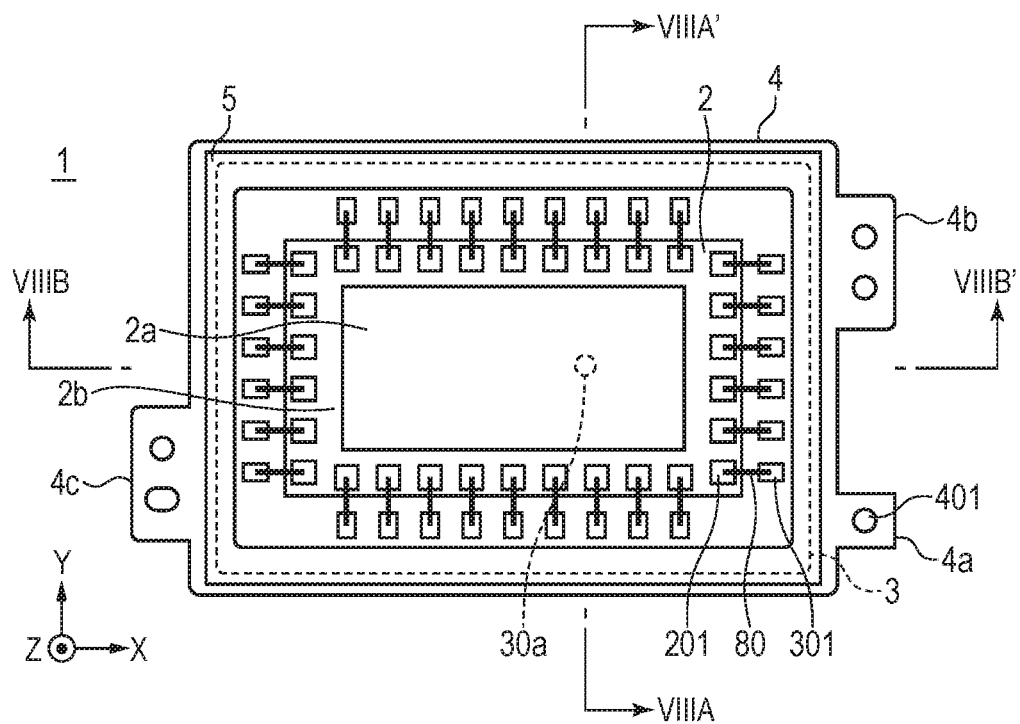
FIG. 7A is a planar view of an electronic module according to a fifth embodiment.
Figure 7B:
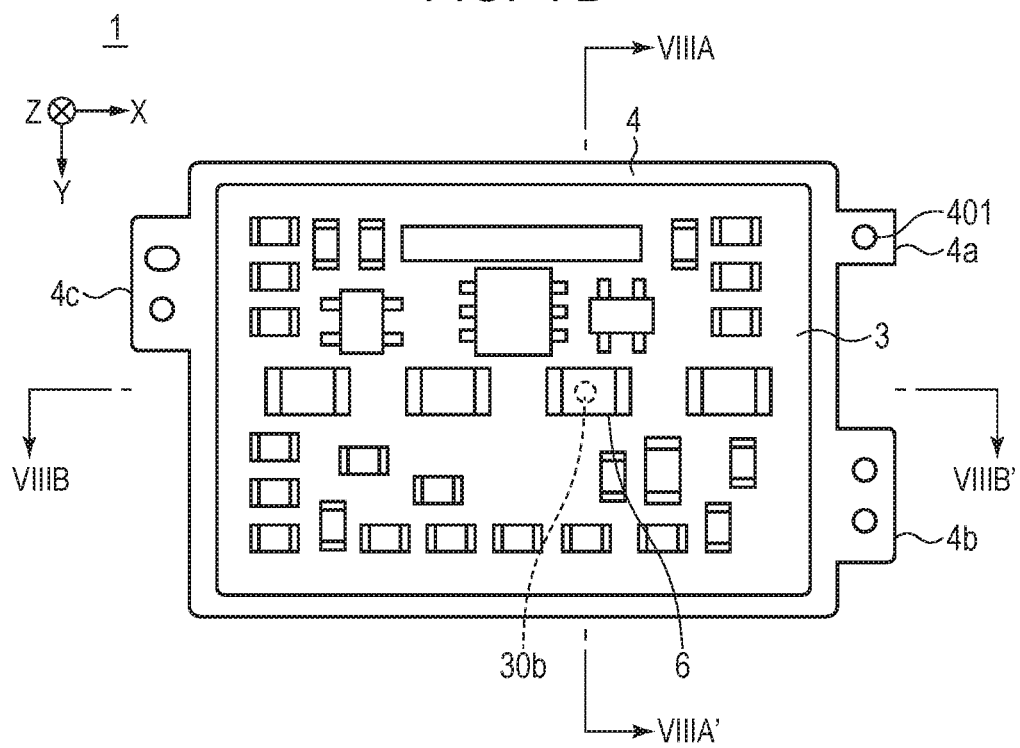
FIG. 7B is a planar view of the electronic module according to the fifth embodiment.
Figure 8A:
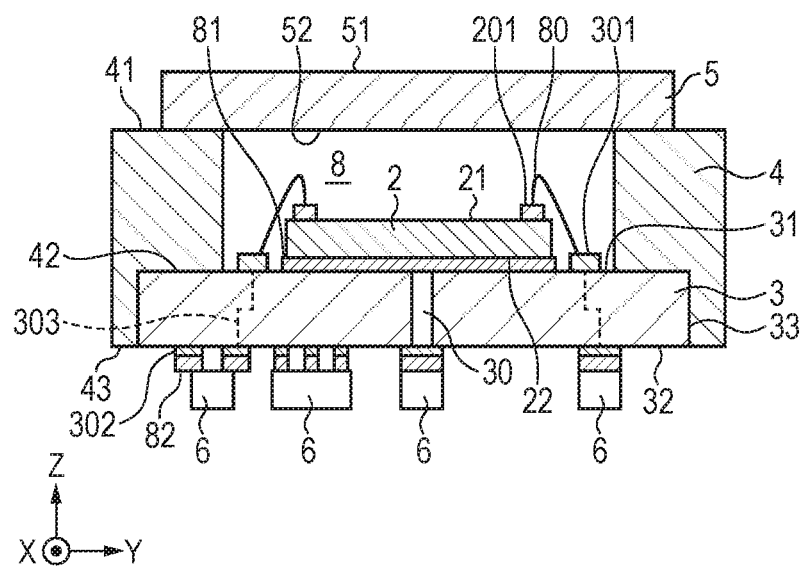
FIG. 8A is a sectional view of the electronic module according to the fifth embodiment.
Figure 8B:
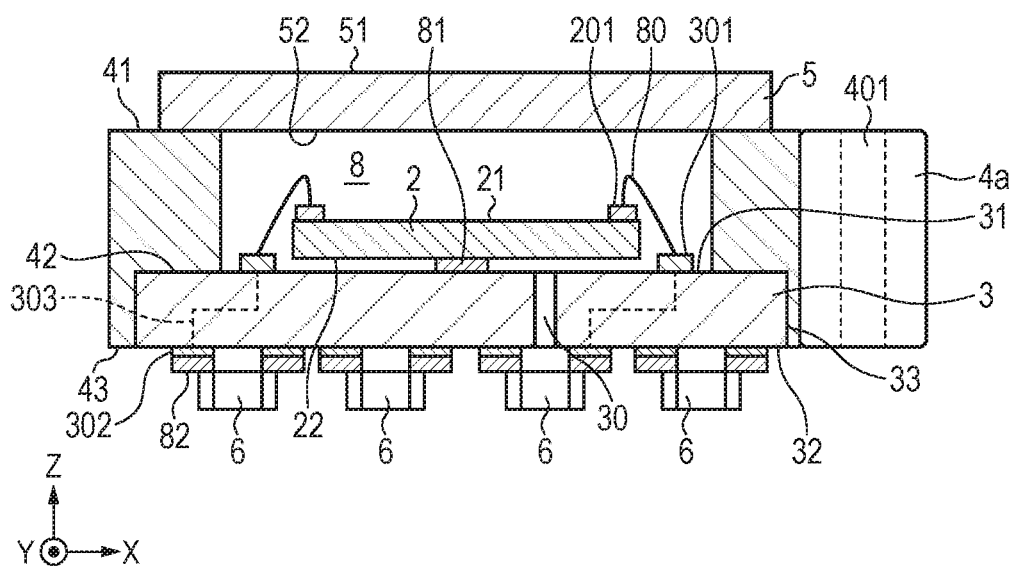
FIG. 8B is a sectional view of the electronic module according to the fifth embodiment.

FIG. 7A is a top surface view of the electronic module 1, and FIG. 7B is a bottom surface view of the electronic module 1. FIG. 8A is a sectional view of the electronic module 1 taken along a line VIIIA-VIIIA' in FIG. 7A and FIG. 7B, and FIG. 8B is a sectional view of the electronic module 1 taken along a line VIIIB-VIIIB'.

Also in the present embodiment, an air gap is formed between the component 6 and the lower surface 32 of the substrate 3, and a foreign material from the external space is blocked by the component 6 because the opening 30b of the hole portion 30 is formed at a position facing the component 6. Therefore, as with the first embodiment, entry of a foreign material from the external space into the internal space 8 can be suppressed while an increase of internal pressure is suppressed.

In the present embodiment, a position of the hole portion 30 on the upper surface 31 of the substrate 3 is different from that of the first embodiment. The hole portion 30 on the upper surface 31 of the substrate 3 is formed on the orthogonal projection region of the lower surface 22 of the electronic device 2. That is, the opening 30a on the upper surface 31 of the substrate 3 is formed at a position facing the lower surface 22 of the electronic device 2. While the lower surface 22 of the electronic device 2 is fixed to the upper surface 31 of the substrate 3 via the adhesive material 81, the opening 30a is formed at a position where the adhesive material 81 is not applied. Thereby, the hole portion 30 communicates with the internal space 8 via the air gap corresponding to the thickness of the adhesive material 81. When the electronic device 2 is an imaging device or the like, adhesion of a foreign material larger than a predetermined size to the upper surface 21 of the electronic device 2 or the cover lower surface 52 decreases the image capturing quality or the image display quality. In the present embodiment, the hole portion 30 is formed on the orthogonal projection region of the lower surface 22 of the electronic device 2 and communicates with the internal space 8. Thus, even if a foreign material intrudes from the external space into the internal space 8, adhesion of the foreign material to the upper surface 21 of the electronic device 2 or the cover lower surface 52 can be suppressed.

Figure 9:
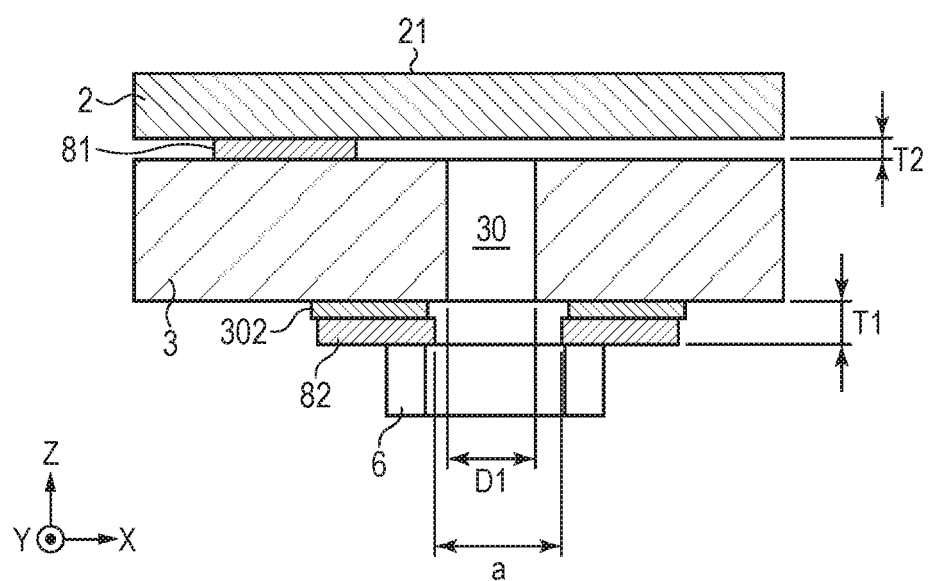
FIG. 9 is a sectional view of a part of the electronic module according to the fifth embodiment.

FIG. 9 is a sectional view of a part of the electronic module 1 in FIG. 8A, which is a diagram used for describing the hole portion 30 in detail. In FIG. 9, the hole diameter of the hole portion 30 is denoted as "D1", the distance of a first air gap formed between the lower surface 32 of the substrate 3 and the component 6 is denoted as "T1", and the distance of a second air gap formed between the upper surface 31 of the substrate 3 and the electronic device 2 is denoted as "T2". Further, the length of a region in which the component 6, which is on the orthogonal projection region of the hole portion 30, is not fixed to the outer terminal 302 is denoted as "a". That is, the length "a" corresponds to a length of the edge that forms the first air gap out of the outer edges of the component 6. In the following description, "air gap distance" means the shortest distance between two members. The shortest distance between a surface of one member and a surface of the other member of two members is defined as "air gap distance".

An air gap distance T1 corresponds to the sum of the thickness of the outer terminal 302 and the thickness of the conductive material 82, and an air gap distance T2 corresponds to the thickness of the adhesive material 81. In the present embodiment, the hole diameter D1 and the air gap distance T1 preferably satisfy an equation D1>T1. That is, by decreasing the air gap distance T1 between the substrate 3 and the component 6 and arranging the component 6 close to the substrate 3, it is possible to prevent entry of a foreign material that is larger than the air gap distance T1. On the other hand, by setting the hole diameter D1 to be larger than the air gap distance T1, it is possible to reduce the air resistance in the hole portion 30 and improve the ventilation between the internal space 8 and the external space. Compared to the case where an equation D1 T1 is satisfied, the effect of suppressing an increase in internal pressure can be enhanced. According to the present embodiment, the advantage of suppressing an increase in internal pressure can be further enhanced in addition to the advantage of suppressing entry of a foreign material from the external space.

Further, the air gap distance T1 and the air gap distance T2 preferably satisfy an equation $T1 \geq T2$. By reducing the air gap distance T2 formed between the substrate 3 and the electronic device 2 and arranging the electronic device 2 as close as possible to the substrate 3, it is possible to prevent entry of a foreign material that is larger than the air gap distance T2 from the hole portion 30 into the internal space 8. Thereby, adhesion of the foreign material to the upper surface 21 of the electronic device 2 or the cover lower surface 52 can be prevented, and degradation of the image quality caused by a foreign material can be avoided.

Furthermore, the air gap distance T2 further preferably satisfies an equation $10 \mu M \leq T2 \leq 20 \mu M$. Since the air gap distance T2 is less than or equal to 20 μm, even if a foreign material adheres to the upper surface 21 of the electronic device 2 or the cover lower surface 52, the influence on the image quality can be minimized. On the other hand, since the air gap distance T2 is greater than or equal to 10 μm, a gap sufficient for ventilation between the internal space 8 and the outside can be maintained, and an increase of internal pressure can be effectively suppressed.

Figure 10A:
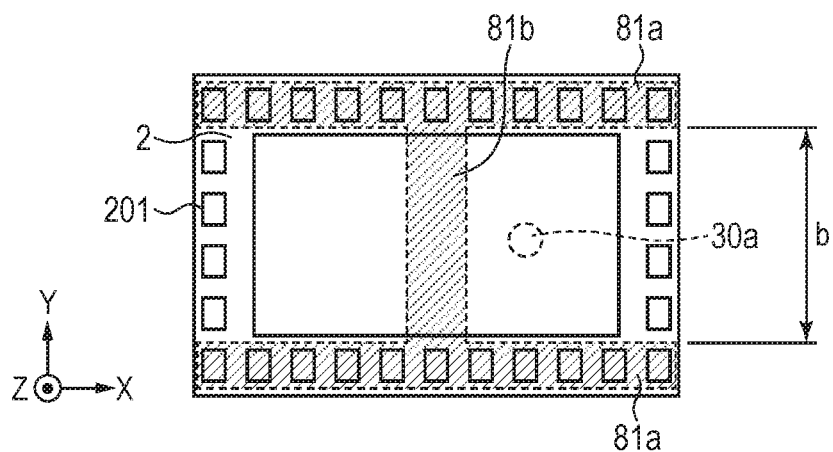
FIG. 10A is a perspective planar view of the electronic device according to the fifth embodiment.
Figure 10B:
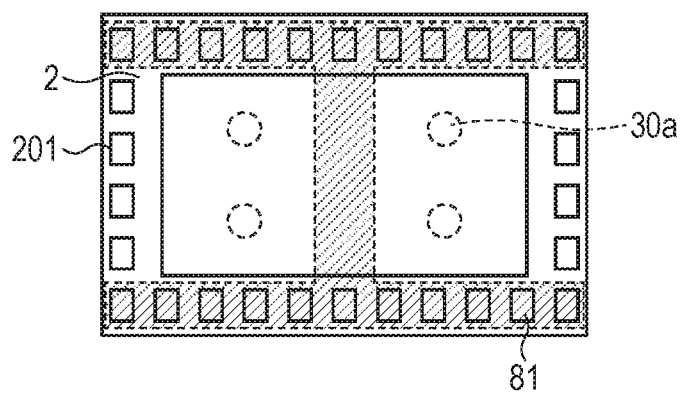
FIG. 10B is a perspective planar view of the electronic device according to the fifth embodiment.
Figure 10C:
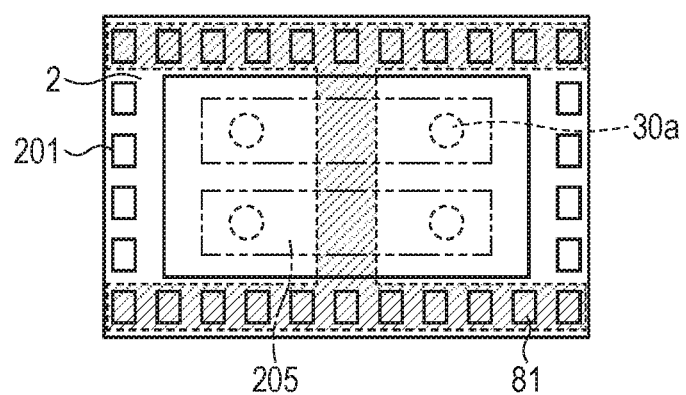
FIG. 10C is a perspective planar view of the electronic device according to the fifth embodiment.

FIG. 10A, FIG. 10B, and FIG. 10C are perspective planar views of a part of the electronic module according to the present embodiment, which are planar views when the electronic device 2 and the adhesive material 81 are viewed through downward.

The adhesive material 81 is applied to adhesive parts 81a in the longitudinal direction of the electronic device 2 and an adhesive part 81b that connects the centers of two adhesive parts 81a to each other, respectively, in a planar view. The length of a region surrounded by the adhesive parts 81a and 81b is here denoted as "b". That is, the length b indicates a region where the adhesive material 81 is not applied in the electronic device 2, that is, a length of a rectangular unapplied region defined by the sides of the adhesive material 81 and the external shape of the electronic device 2. The unapplied region defined by the length b communicates with the hole portion 30 and forms a region used for ventilation. The sectional area of the hole diameter D1 is denoted as "e", the area of a region defined by the length a is denoted as "f", and the area of a surface defined by the length b and the air gap distance T2 is denoted as "g". In this case, three equations, $e \geq f$, $e \geq g$, and $f \geq g$, are preferably satisfied at the same time. Since the area e of the hole portion 30 is greater than or equal to the area f, which is the area of an air exit part of the component 6, the air expanded in the internal space 8 due to an increase in the temperature increase or a reduction in pressure of the external space can be effectively ventilated to the outside. That is, the air resistance in an air gap formed between the lower surface 32 of the substrate 3 and the component 6 can be suppressed.

Similarly, with the sectional area e being greater than the area g of a portion, which is a passage from the internal space 8 to the hole portion 30, the air expanded in the internal space 8 can be effectively ventilated to the outside. That is, the air discharged from the hole portion 30 can be effectively ventilated to the outside through the region of the area f. Further, the areas e, f, and g preferably further satisfy a relationship $e=f=g$. Thereby, air passages from the internal space 8 to the outside are formed with the same area, the air resistance in the passages is suppressed, and the effect of suppressing an increase in internal pressure can be further enhanced.

In FIG. 9 and FIG. 10A, a single hole portion 30 is formed in the substrate 3, and the component 6 located on the orthogonal projection area of the hole portion 30 may be a chip capacitor of 2 mm×1.25 mm, for example. Further, it is assumed that the length a=1 mm, the external shape of the electronic device 2 is 28 mm×19 mm, the length b=10 mm, the air gap distance T2=0.01 mm. Since the areas e, f, and g are expressed as the area $e=\pi \times (D1/2)^2$, the area $f=2 \times a \times T1$, and the area $g=b \times T2$, the air gap distance T1 which satisfies the relationship of $e=f=g$ is 0.05 mm, the hole diameter D1 is 0.356 mm, and the areas e, f, and g are 0.1 mm², respectively. To form such air gap distances T1 and T2, the adhesive material 81 and the conductive material 82 are preferably formed in an appropriate and even thickness. For example, a spacer in an appropriate size is preferably provided to the adhesive material 81 and the conductive material 82. Further, to set the lengths a and b to appropriate values, processing condition such as a coating amount of the adhesive material 81 or the conductive material 82 is preferably managed. A positioning member used for setting the length a or b may be provided to the upper surface 31 and the lower surface 32 of the substrate 3. Note that the number and the positions of hole portions 30, the shape of the adhesive material 81, and the length and the shape of various materials are not limited to the examples described above, and modifications can be suitably made as described below.

As illustrated in FIG. 10B, a plurality of hole portions 30 may be formed in the substrate 3. In such a case, a plurality of hole portions 30 are preferably arranged so as to be symmetrical with respect to the center of the external shape of the substrate 3. By forming a plurality of hole portions 30, it is possible to improve the permeability performance and enhance the effect of suppressing an increase in internal pressure. Further, in the case where a plurality of hole portions 30 are formed, even when the hole diameter is reduced, the same effect of suppressing an increase in internal pressure as with the case where a single hole portion 30 is formed can be obtained. By forming a plurality of hole portions 30 having a small hole diameter, it is possible to prevent entry of a smaller foreign material without decreasing the effect of suppressing an increase in internal pressure. Further, by arranging the hole portions 30 so as to be symmetric with respect to the center of the external shape of the substrate 3, it is possible to efficiently ventilate the air expanded in the internal space 8 evenly and enhance the effect of suppressing an increase in internal pressure.

As illustrated in FIG. 10C, a plurality of hole portions 30 may be formed on the orthogonal projection region of a heat generation portion 205 of the electronic device 2. The heat generation portion 205 here is a portion in which the temperature during the operation may be higher than the other portions in the electronic device 2. By forming a hole portion 30 on the orthogonal projection region of the heat generation portion 205 of the electronic device 2, that is, by forming the hole portion 30 immediately below the heat generation portion 205, it is possible to efficiently ventilate the air heated and expanded by driving the electronic device 2 or the like and enhance the effect of suppressing an increase in internal pressure.

As described above, according to the present embodiment, the effect of preventing entry of a foreign material and suppressing an increase in internal pressure in the internal space can be further enhanced.

Sixth Embodiment

Next, an electronic module 1 according to the present embodiment will be described. The electronic module 1 according to the present embodiment mainly differs from the fifth embodiment in the hole diameter of the hole portion 30. A configuration of the electronic module 1 according to the present embodiment different from the fifth embodiment will be mainly described below.

Figure 11:
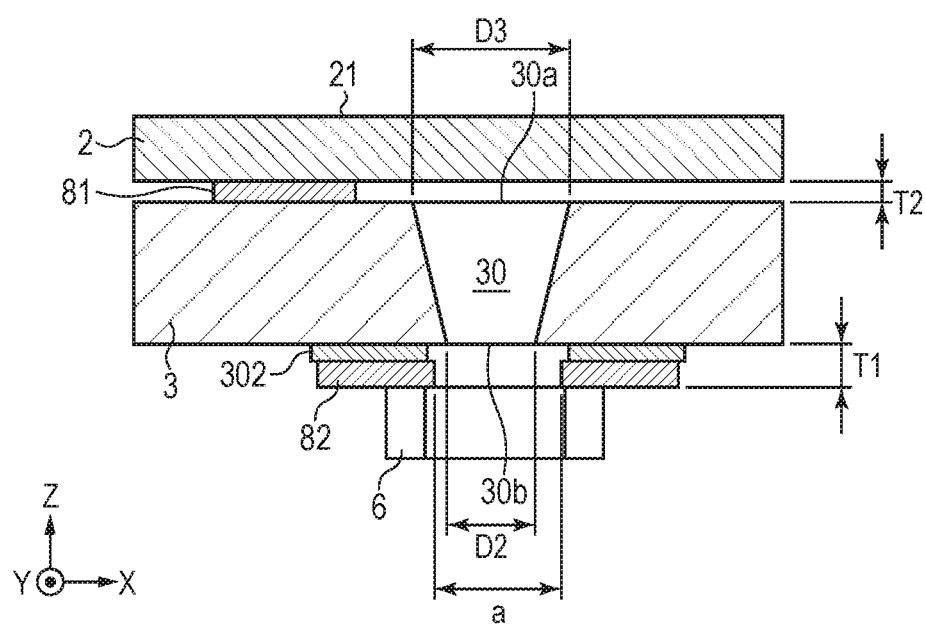
FIG. 11 is a sectional view of an electronic module according to a sixth embodiment.

FIG. 11 is an enlarged sectional view of a part of the electronic module 1 according to the present embodiment, which is a diagram used for describing the hole portion 30 in detail. In the present embodiment, the hole portion 30 is formed in a tapered shape in the substrate 3. The hole portion 30 has different hole diameters at the opening 30a of the upper surface 31 of the substrate 3 and the opening 30b of the lower surface 32 of the substrate 3, respectively. When a hole diameter on the lower surface 32 side is denoted as "D2" and a hole diameter on the upper surface 31 side is denoted as "D3", the hole portion 30 is formed so as to satisfy an equation D2<D3. That is, the hole portion 30 is formed such that the hole diameter increases from the opening 30b of the lower surface 32 of the substrate 3 toward the opening 30a of the upper surface 31 of the substrate 3. When the hole portion 30 satisfies the equation D2<D3, the air from the internal space 8 is easily discharged and the air from the outside is less likely to be inhaled. Therefore, compared to the fifth embodiment, the effect of suppressing entry of a foreign material can be further enhanced.

Further, when a sectional area of the hole diameter D2 is denoted as "e'" and a sectional area of the hole diameter D3 is denoted as "e''", two equations e' f and e'' g are preferably satisfied at the same time in the relationship between the area f and the area g defined in FIG. 9, FIG. 10A, FIG. 10B, and FIG. 10C. With the sectional area e' being greater than or equal to the area f, which is the area of an air exit part of the electronic module 1, the air expanded in the internal space 8 due to an increase in the temperature or a reduction in pressure of the external space can be effectively ventilated. That is, the resistance at the air exit can be suppressed. Similarly, with the sectional area e'' being greater than the area g of a portion, which is a passage from the internal space 8 to the hole portion 30, the air expanded in the internal space 8 can be effectively ventilated. That is, the air passing through the passage to the hole portion 30 can be efficiently ventilated from the hole portion 30 to the outside with passing through the region of the area f. Further, two equations e'=f and e''=g are preferably satisfied at the same time. Thereby, the air resistance in the passage from the internal space 8 to the outside can be suppressed, and the effect of suppressing an increase in internal pressure can be further enhanced.

While the present embodiment has been described above, the present disclosure may include an electronic module, an electronic device, or the like in which a plurality of embodiments described above are combined.

Seventh Embodiment

Figure 12:
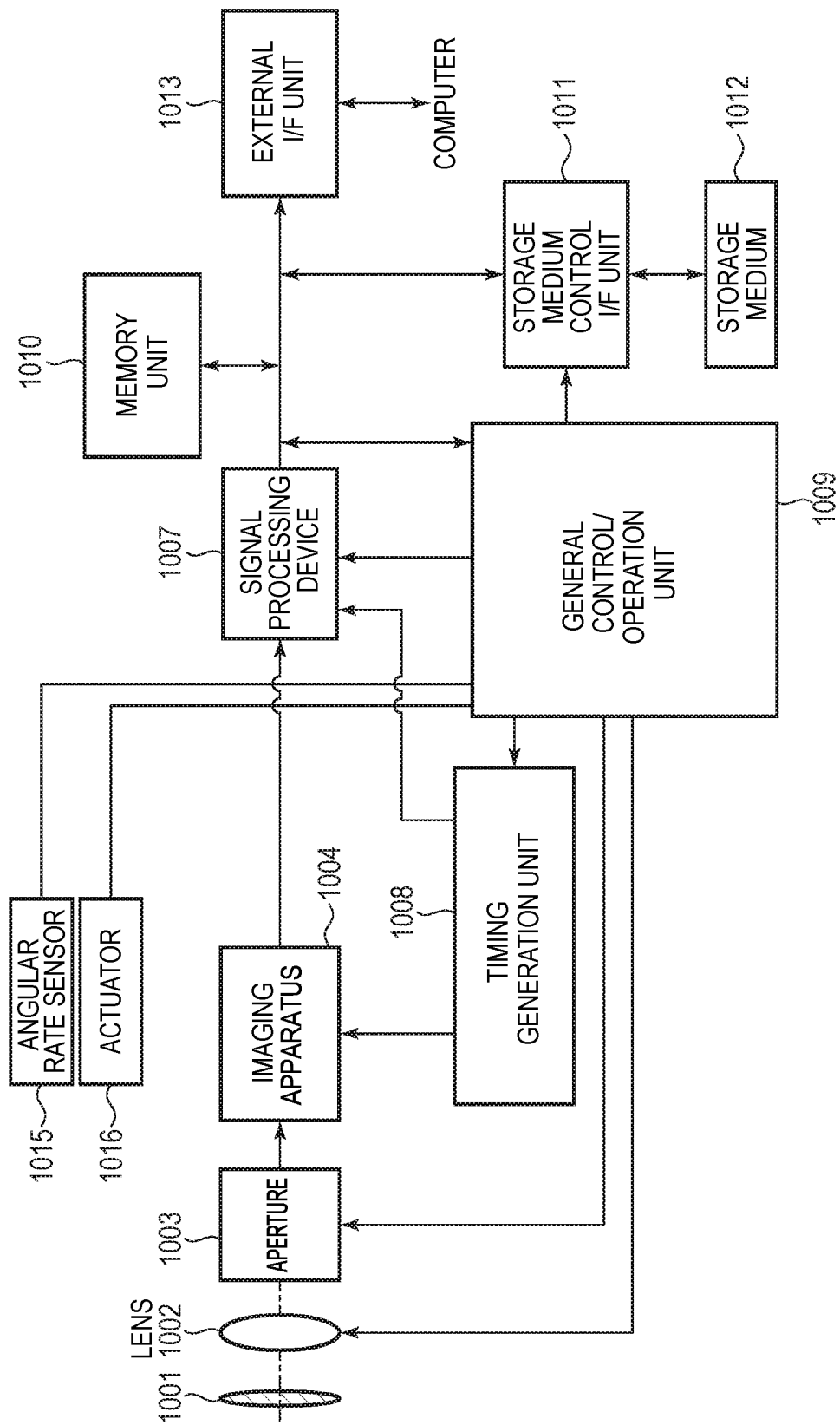
FIG. 12 is a block diagram of an imaging system according to a seventh embodiment.

The electronic modules according to the embodiments described above are applicable to various imaging systems. The imaging system may be a digital still camera, a digital camcorder, a camera head, a copying machine, a facsimile, a mobile phone, an on-vehicle camera, an observation satellite, a surveillance camera, or the like. FIG. 12 illustrates a block diagram of a digital still camera as an example of the imaging system.

The imaging system illustrated in FIG. 12 includes a barrier 1001, a lens 1002, an aperture 1003, an imaging apparatus 1004, a signal processing device 1007, a timing generation unit 1008, a general control/operation unit 1009, a memory unit 1010, a storage medium control I/F unit 1011, a storage medium 1012, an external I/F unit 1013, an angular rate sensor (determination unit) 1015, and an actuator 1016. The barrier 1001 protects the lens 1002, and the lens 1002 captures an optical image of a subject onto the imaging apparatus 1004. The aperture 1003 changes a light amount passing through the lens 1002. The imaging apparatus 1004 is configured by the electronic module described above and converts the optical image captured by the lens 1002 into image data. The signal processing device 1007 performs various corrections and data compression on the image data output from the imaging apparatus 1004. The timing generation unit 1008 outputs various timing signals to the imaging apparatus 1004 and the signal processing device 1007. The general control/operation unit 1009 controls the entire digital still camera, and the memory unit 1010 temporarily stores image data. The storage medium control I/F unit 1011 is an interface that performs storage or readout of image data on the storage medium 1012, and the storage medium 1012 is a removable storage medium such as a semiconductor memory used for storage or readout of the image data. The external I/F unit 1013 is an interface used for communicating with an external computer or the like. The timing signal or the like may be input from the outside of the imaging system, and the imaging system may have at least the imaging apparatus 1004 and the signal processing device 1007 that processes an image signal output from the imaging apparatus 1004.

The imaging apparatus 1004 and an analog-to-digital (AD) conversion unit may be provided on the same semiconductor substrate, or the imaging apparatus 1004 and the AD conversion unit may be formed on different semiconductor substrates. Further, the imaging apparatus 1004 and the signal processing device 1007 may be formed on the same semiconductor substrate. Each pixel may include a first photoelectric conversion unit and a second photoelectric conversion unit. The signal processing device 1007 may be configured to process a pixel signal generated in the first photoelectric conversion unit and a pixel signal generated in the second photoelectric conversion unit and acquire information on a distance from the imaging apparatus 1004 to the subject.

The angular rate sensor 1015 is fixed to a casing of the imaging system or the like and detects camera shake of the imaging system. The camera shake is detected as an amount of displacement in the X-axis direction and the Y-axis direction, respectively, on the light receiving surface of the imaging apparatus. The actuator 1016 is formed of an electromagnetic drive mechanism, a Piezo drive mechanism, or the like and displaces the position of the imaging apparatus 1004. The actuator 1016 is controlled by the general control/operation unit 1009 and drives the imaging apparatus 1004 in the direction that counteracts the amount of displacement detected by the angular rate sensor 1015.

Figure 13A:
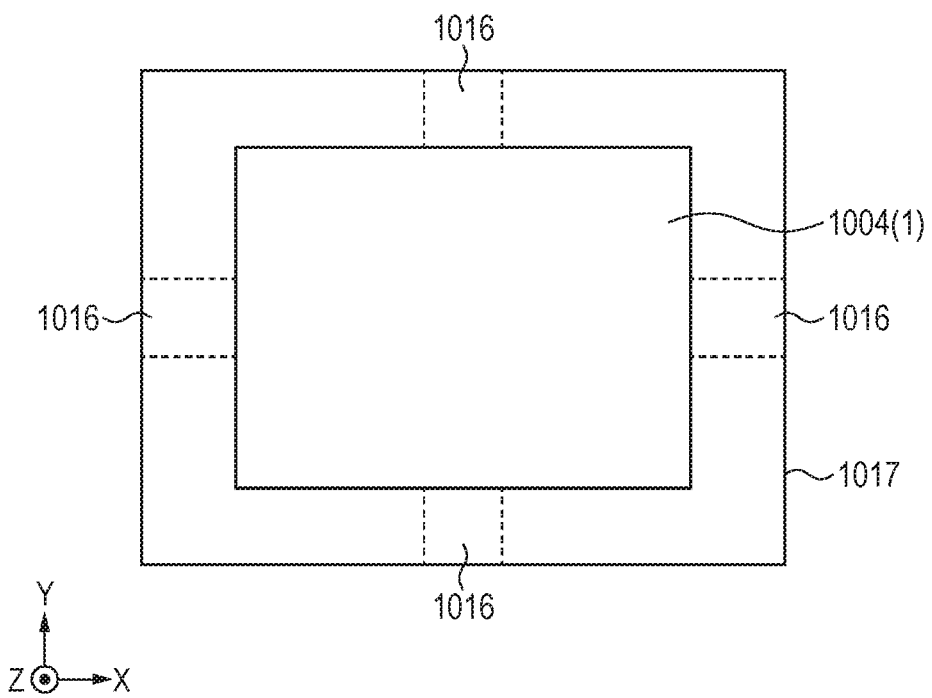
FIG. 13A is a diagram used for describing an imaging apparatus according to the seventh embodiment.
Figure 13B:
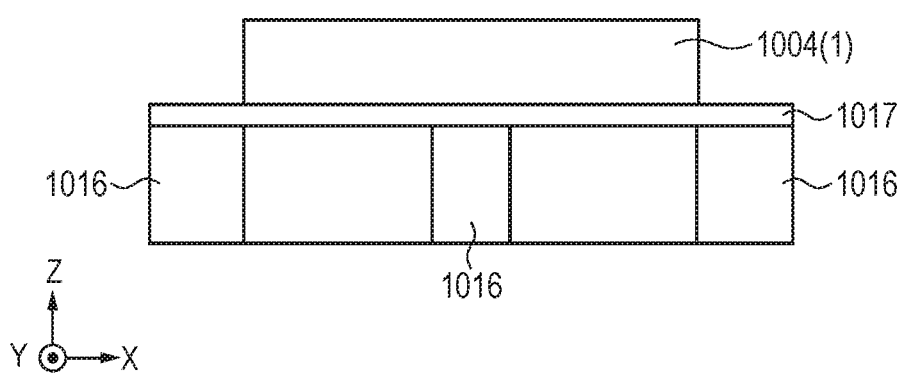
FIG. 13B is a diagram used for describing the imaging apparatus according to the seventh embodiment.

FIG. 13A and FIG. 13B are diagrams describing the imaging apparatus 1004 according to the present embodiment. FIG. 13A is a planar view of the imaging apparatus 1004, and FIG. 13B is a side view of the imaging apparatus 1004. The imaging apparatus 1004 is attached on the upper surface of a substrate 1017, and the actuator 1016 is provided on the lower surface of the substrate 1017. The actuator 1016 can move the imaging apparatus 1004 in the X-direction and the Y-direction.

The imaging apparatus 1004 according to the present embodiment is formed of the electronic module 1 according to the first to sixth embodiments. In the electronic module 1, the electronic device 2 such as an imaging element is directly attached to the substrate 3 without using a ceramic package. Thereby, the imaging apparatus 1004 can be reduced in weight, and a camera shake correction mechanism in a sensor shift scheme that controls the displacement of the imaging apparatus 1004 can be employed.

Eighth Embodiment

Figure 14A:
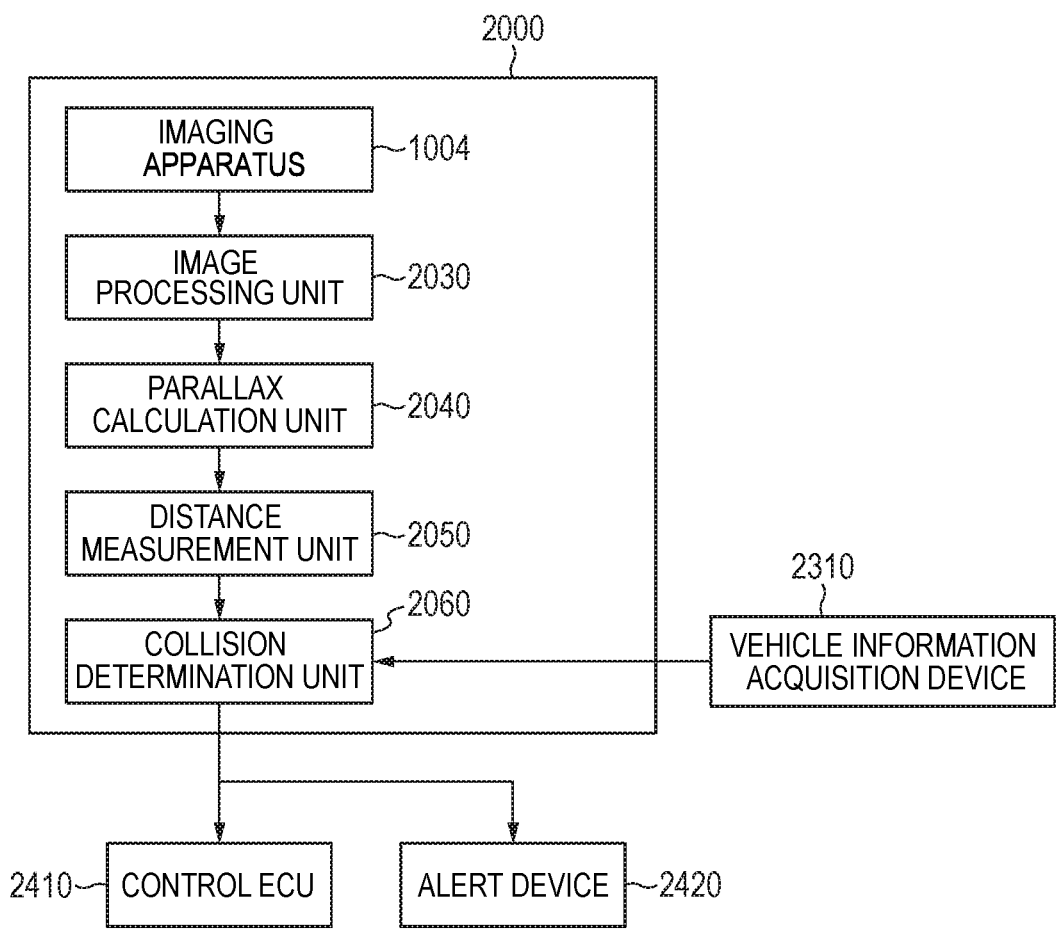
FIG. 14A is a block diagram of an imaging system related to an on-vehicle camera according to an eighth embodiment.
Figure 14B:
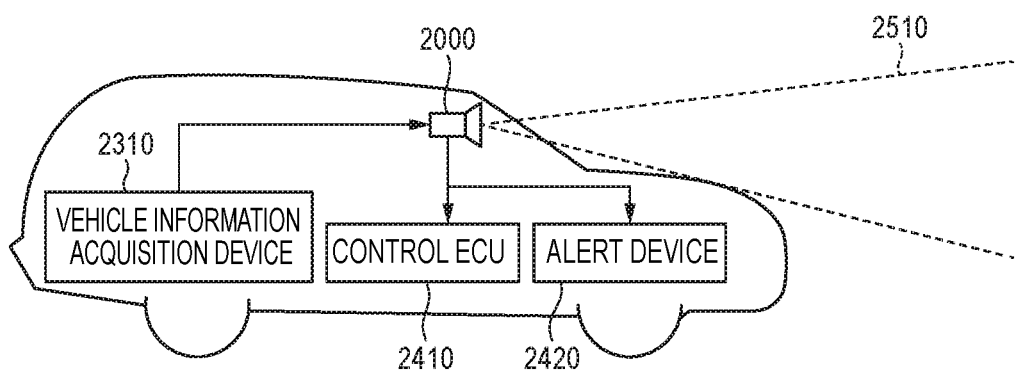
FIG. 14B is a block diagram of the imaging system related to the on-vehicle camera according to the eighth embodiment.

FIG. 14A and FIG. 14B are block diagrams of an imaging system related to an on-vehicle camera according to the present embodiment. An imaging system 2000 has the imaging apparatus 1004 in the embodiment described above. The imaging system 2000 has an image processing unit 2030 that performs image processing on a plurality of image data acquired by the imaging apparatus 1004 and a parallax calculation unit 2040 that calculates a parallax (a phase difference of parallax images) from the plurality of image data acquired by the imaging system 2000. Further, the imaging system 2000 has a distance measurement unit 2050 that calculates a distance to the object based on the calculated parallax and a collision determination unit 2060 that determines whether or not there is a collision possibility based on the calculated distance. Here, the parallax calculation unit 2040 and the distance measurement unit 2050 are an example of a distance information acquisition unit that acquires distance information on the distance to the object. That is, the distance information is information on a parallax, a defocus amount, a distance to an object, or the like. The collision determination unit 2060 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA) or an Application Specific Integrated Circuit (ASIC) or may be implemented by combination thereof.

The imaging system 2000 is connected to the vehicle information acquisition device 2310 and can acquire vehicle information such as a vehicle speed, a yaw rate, a steering angle, or the like. Further, the imaging system 2000 is connected to a control ECU 2410, which is a control device that outputs a control signal that causes a vehicle to generate braking force based on a determination result by the collision determination unit 2060. Further, the imaging system 2000 is connected to an alert device 2420 that issues an alert to a driver based on a determination result by the collision determination unit 2060. For example, when the collision probability is high as the determination result of the collision determination unit 2060, the control ECU 2410 performs vehicle control to avoid a collision or reduce damage by applying a brake, pushing back an accelerator, suppressing engine power, or the like. The alert device 2420 alerts a user by sounding an alert such as a sound, displaying alert information on a display of a car navigation system or the like, providing vibration to a seat belt or a steering wheel, or the like. The imaging system 2000 functions as a control unit that performs the control of operation that controls a vehicle as described above.

In the present embodiment, an area around a vehicle, for example, a front area or a rear area is captured by using the imaging system 2000. FIG. 14B illustrates the imaging system in a case of capturing a front area of a vehicle (capturing area 2510). The vehicle information acquisition device 2310 as an imaging control unit transmits instructions to the imaging system 2000 or the imaging apparatus 1004 so as to perform the operations described in the first to fifth embodiment described above. Such a configuration can further improve the ranging accuracy.

While the example of control to avoid a collision to another vehicle has been described above, the embodiment is also applicable to automatic driving control to follow another vehicle, automatic driving control not to go out of a traffic lane, or the like. Further, the imaging system can be applied to not only a vehicle such as the subject vehicle but also a moving unit (moving apparatus) such as a ship, an airplane, an industrial robot, or the like, for example. In addition, the imaging system can be widely applied to not only a moving unit but also a device which utilizes object recognition such as an intelligent transportation system (ITS).

Another Embodiment

The present technology is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is one of the embodiments of the present disclosure.

Note that each of the embodiments described above merely illustrates an example of an implementation when the present technology is performed, and the technical scope of the present invention should not be restrictively understood by these embodiments. That is, the present invention can be implemented in various forms without departing from the technical spirit or the main features thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-058243, filed Mar. 26, 2018, which is hereby incorporated by reference herein in its entirety.

What is claimed is:

1. An electronic module comprising:
a substrate having a first main surface and a second main surface;
an electronic device attached to the first main surface;
a component connected to the second main surface via a conductive material;
a frame attached to the first main surface so as to surround the electronic device; and
a cover attached to the frame so as to face the electronic device,
wherein an internal space is formed by the substrate, the frame, and the cover,
wherein the substrate is provided with a hole portion communicating the internal space with an external space,
wherein the hole portion has a first opening in the first main surface and has a second opening in the second main surface, and
wherein the component is disposed to cover the second opening.

2. The electronic module according to claim 1, wherein the first opening is provided at a position facing the electronic device.

3. The electronic module according to claim 1, wherein a hole diameter of the hole portion is smaller than an external shape of the component.

4. The electronic module according to claim 1, wherein a hole diameter of the hole portion is larger than a distance of a first air gap formed between the second main surface and the component.

5. The electronic module according to claim 4, wherein a distance of a second air gap formed between the first main surface and the electronic device is less than or equal to the distance of the first air gap.

6. The electronic module according to claim 5, wherein the distance of the second air gap is greater than or equal to 10 μm and less than or equal to 20 μm.

7. The electronic module according to claim 5, wherein equations $e \geq f$, $e \geq g$, and $f \geq g$ are satisfied, where an area of the second opening of the hole portion is denoted as e, an area of a surface defined by a length of an edge forming the first air gap in outer edges of the component and the distance of the first air gap is denoted as f, and an area of a surface defined by a length of an edge forming the second air gap in outer edges of the electronic device and the length of the second air gap is denoted as g.

8. The electronic module according to claim 5, wherein a diameter of the first opening is larger than a diameter of the second opening.

9. The electronic module according to claim 8, wherein two equations $e' \geq f$ and $e'' \geq g$ are satisfied, where an area of the second opening is denoted as e', an area of a surface defined by a length of an edge that forms the first air gap in outer edges of the component and the distance of the first air gap is denoted as f, an area of the first opening is denoted as e'', and an area of a surface defined by a length of an edge that forms the second air gap in outer edges of the electronic device and the length of the second air gap is denoted as g.

10. The electronic module according to claim 1, wherein the substrate has a plurality of hole portions, and the plurality of hole portions are arranged so as to be symmetric with respect to the center of the substrate in a planar view.

11. The electronic module according to claim 1, wherein the first opening is formed at a position facing a heat generation portion of the electronic device.

12. The electronic module according to claim 1, wherein a recess is formed on an inner periphery of the frame, and a side end portion of the substrate is inserted into the recess.

13. The electronic module according to claim 12, wherein the second main surface of the substrate and one surface of the frame are located on a single plane.

14. The electronic module according to claim 1, wherein the frame is formed including a resin material.

15. The electronic module according to claim 1, wherein the electronic device is an imaging device or a display device.

16. An imaging system comprising:
the electronic module according to claim 15 that has the imaging device; and
a signal processing device that processes pixel signals output from the imaging device.

17. The imaging system according to claim 16 comprising:
a detection unit that detects motion of the imaging system; and
an actuator that displaces the electronic module based on a signal from the detection unit.

18. The imaging system according to claim 16,
wherein the imaging device has a plurality of pixels,
wherein the plurality of pixels have a plurality of photoelectric conversion units, and
wherein the signal processing device processes the pixel signals generated by the plurality of photoelectric conversion units, respectively, and acquires distance information on a distance from the imaging device to a subject.

19. The electronic module according to claim 1, wherein the component is a diode, a transistor, a chip capacitor or an integrated circuit.

20. An electronic module comprising:
a substrate having a first main surface and a second main surface;
an electronic device attached to the first main surface;
a component connected to the second main surface via a conductive material;
a frame attached to the first main surface so as to surround the electronic device; and
a cover attached to the frame so as to face the electronic device,
wherein the substrate has a hole portion having a first opening in the first main surface and a second opening in the second main surface and communicating an internal space formed by the substrate, the frame, and the cover with an external space, and
wherein the component is disposed to face the second opening,
wherein the imaging device has a plurality of pixels,
wherein the plurality of pixels have a plurality of photoelectric conversion units, and
wherein the signal processing device processes the pixel signals generated by the plurality of photoelectric conversion units, respectively, and acquires distance information on a distance from the imaging device to a subject.

* * * * *